(12) United States Patent
Takano et al.

(10) Patent No.: US 7,973,522 B2
(45) Date of Patent: Jul. 5, 2011

(54) DC/DC CONVERTER, AND POWER AMPLIFIER APPLYING THE SAME

(75) Inventors: Takeshi Takano, Kawasaki (JP); Yasuyuki Oishi, Kawasaki (JP); Tokuro Kubo, Kawasaki (JP); Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/005,380

(22) Filed: Dec. 27, 2007

(65) Prior Publication Data

US 2008/0144338 A1 Jun. 19, 2008

Related U.S. Application Data

(63) Continuation of application No. PCT/JP2005/012027, filed on Jun. 30, 2005.

(51) Int. Cl.
*G05F 1/40* (2006.01)
(52) U.S. Cl. ...................................... 323/280
(58) Field of Classification Search .................. 363/16, 363/20; 323/280, 282, 351, 281; 330/262, 330/298; 320/262, 298
See application file for complete search history.

(56) References Cited

U.S. PATENT DOCUMENTS

| | | | | |
|---|---|---|---|---|
| 3,659,218 A | * | 4/1972 | Haneda | 330/298 |
| 3,825,684 A | * | 7/1974 | Ito et al. | 381/22 |
| 6,078,275 A | * | 6/2000 | Borgen | 341/144 |
| 6,137,358 A | | 10/2000 | Midya et al. | |
| 6,636,103 B2 | | 10/2003 | Wurcer et al. | |
| 6,700,440 B2 | | 3/2004 | Hareyama | |
| 2003/0058956 A1 | | 3/2003 | Rosnell et al. | |

FOREIGN PATENT DOCUMENTS

| | | |
|---|---|---|
| JP | 2002-353741 A | 12/2002 |
| JP | 2003-92522 A | 3/2003 |
| JP | 2004-520754 A | 7/2004 |

OTHER PUBLICATIONS

Sahu B. et al. "A High-Efficiency Linear RF Power Amplifier with a Power-Tracking Dynamically Adaptive Buck-Boost Supply" IEEE Transactions on Microwave Theory and Techniques, IEEE Service Center, Piscataway, NJ. US, vol. 52, No. 1 Part 01 Jan. 1, 2004, pp. 112-120, XP001046321 ISSN: 0018-9480 *p. 114-p. 115*.
Yamashita N. "A Novel Low-Power Dissipation and High-Speed Converter-Control-IC for the Transmitting Amplifier of Digital Portable Telephones" IEICE Transactions on Communications, Communications Society, Tokyo JP, vol. E77-B, No. 12, Dec. 1, 1994, pp. 1600-1606, XP000498076 ISSN: 0916-8516 *p. 1600-p. 1602*.
Supplementary European Search Report dated Jan. 29, 2010 received in Application No. 05765371.9 2207/1916759 PCT/JP2005/012027.

* cited by examiner

*Primary Examiner* — Adolf Berhane
(74) *Attorney, Agent, or Firm* — Murphy & King, PC

(57) ABSTRACT

A DC/DC converter capable of controlling an output signal using a broadband signal input is provided. By employing the above DC/DC converter as a power supply, a highly efficient power amplifier can be configured. The above DC/DC converter includes two class-C amplifiers, a rectifier circuit connected between each output of the two class-C amplifiers, and an oscillator of a predetermined frequency signal. The predetermined frequency signal output from the oscillator is input to each of the two class-C amplifiers, and by controlling the phase difference of the predetermined frequency signal input to the two class-C amplifiers, the magnitude of a direct current voltage output from the rectifier circuit is made variable.

5 Claims, 11 Drawing Sheets

DC/DC CONVERTER, AND POWER AMPLIFIER APPLYING THE SAME

CROSS REFERENCE TO RELATED APPLICATIONS

This application is a continuation of International Application No. PCT/JP2005/12027, filed on Jun. 30, 2005, now pending, herein incorporated by reference.

FIELD OF THE INVENTION

The present invention relates to a DC/DC converter, and a power amplifier applying the same.

BACKGROUND OF THE INVENTION

As the use of broadband in digital mobile radio systems spreads, even higher efficiency in a power amplifier is desired.

Here, referring to FIG. 1, the input/output characteristic and the efficiency of an amplifier is examined. In FIG. 1, the horizontal axis is input power (W), the left vertical axis is output power (W), and the right vertical axis is efficiency. The input power versus the output power characteristic (input/output characteristic) I shows a characteristic that an output growth saturates when the input power (W) becomes a large level. Meanwhile, in regard to the efficiency, the efficiency is low in a region of a small input level, but becomes abruptly improved when the input power reaches a certain value or higher. In short, it is known as a general efficiency characteristic II that the efficiency becomes the maximum when the input power has a value such that the output growth saturates.

Also, when the drain voltage of the power amplifier is varied, the input/output characteristic also varies, as shown by the both-direction arrow in FIG. 1, and the magnitude of the input power producing saturation in the output growth varies as well.

FIG. 2 shows a diagram illustrating a signal waveform after FM analog modulation is performed. When amplifying such the FM analog modulated signal, since the magnitude of the input power is constant, if the drain voltage of the power amplifier is set to such a level that the output power is clipped, the amplifier can be operated at high efficiency, from the efficiency characteristic shown in FIG. 1. However, since the frequency spectrum band of the FM analog modulated signal is broad, it is not advantageous in view of frequency use efficiency.

In particular, with the increase of the number of telephones under contract in a mobile radio system, more efficient use of frequency bands is essential. From this point, a linear modulation scheme having high frequency use efficiency, such as Quadrature Phase Shift Keying (QPSK), has come into use in recent years.

FIG. 3 shows a diagram illustrating a modulated signal waveform according to the linear modulation scheme such as QPSK. In this case, in the region (A in FIG. 3) having a small-level modulated signal, even if a predetermined drain voltage is set, amplification is performed in the linear region of the input/output characteristic I, which is a region of small efficiency. Therefore, it is difficult to increase the total efficiency of the power amplifier.

Here, as the conventional technique to improve power amplifier efficiency, use of switching mode amplifier has been proposed (Patent document 1). The switching mode amplifier described in the above Patent document 1 has a configuration to perform switching mode operation in the own amplifier, and it is also mentioned about an ultra high-speed clock frequency for controlling the switch, such as 256 GHz. However, when a steep pulse of 256 GHz, etc. is used, because matching cannot be made, it is difficult to put into practical use.

[Patent document 1] The official gazette of the Japanese Unexamined Patent Publication No. 2003-92522.

SUMMARY OF THE INVENTION

Accordingly, to utilize the maximum efficiency of the power amplifier examined in the above FIGS. 1 to 3, the inventors of the present invention has considered to vary either a collector voltage or a drain voltage of an amplification device constituting the power amplifier, in an adaptive manner to a linearly modulated signal of Quadrature Phase Shift Keying (QPSK), etc., as shown in FIG. 4.

Specifically, by increasing the drain voltage to 10, 15, 20 V, . . . or the like, according to the input power level of the power amplifier, the input/output characteristic of the power amplifier is varied. FIG. 5 shows a diagram illustrating that output saturation is given to the entire amplitude of the linearly modulated signal waveform of Quadrature Phase Shift Keying (QPSK), etc. shown in FIG. 3. In FIG. 5, to each varying amplitude level of the input signal (A in FIG. 5), an output saturation region in the corresponding input/output characteristic, that is, a maximum efficiency region can be given. In FIG. 5, B indicates a state in which an original voltage waveform (A in FIG. 5) is saturated because of the output saturation region in the input/output characteristic. By this, it becomes possible to obtain maximum efficiency of the power amplifier over the dynamic ranges of the input signal level.

Here, in order to vary the drain voltage corresponding to the input signal as described above, it is sufficient if a DC/DC converter, of which output voltage is controllable by the input signal, is used, as a power supply for the power amplifier. However, in case of a broadband signal of 20 MHz (for example, W-CDMA), the frequency band in the amplitude direction reaches as high as 100 MHz. The existing DC/DC converter has a compatible input frequency of 1 MHz at the highest, of which capacity is short by approximately 100 times.

Accordingly, it is an object of the present invention to provide a DC/DC converter applicable to a broadband signal such as of W-CDMA, and further, to provide a power amplifier enabling acquisition of maximum efficiency, using the above DC/DC converter output as a power supply.

MEANS TO SOLVE THE PROBLEMS

As a first aspect of the present invention to achieve the aforementioned object, there is provided a DC/DC converter including two class-C amplifiers, a rectifier circuit connected between each output of the two class-C amplifiers, and an oscillator of a predetermined frequency signal. The predetermined frequency signal output from the above oscillator is input to each of the two class-C amplifiers, and by controlling the phase difference of the predetermined frequency signal input to the two class-C amplifiers, the magnitude of a direct current voltage output from the rectifier circuit is made variable.

As a second aspect of the present invention to achieve the aforementioned object, there is provided a power amplifier including a power amplifier unit and a power supply circuit for supplying a supply voltage to the power amplifier unit. The above power supply circuit includes two class-C amplifiers, a rectifier circuit connected between each output of the two class-C amplifiers, and an oscillator of a predetermined frequency signal. The predetermined frequency signal output from the oscillator is input to each of the two class-C amplifiers, and by controlling the phase difference of the predetermined frequency signal input to the two class-C amplifiers according to the amplitude of an input signal aimed to be amplified, the magnitude of the supply voltage being output from the rectifier circuit and supplied to the power amplifier unit is made variable.

In the above first and the second aspects, it is possible to configure such that each of the two class-C amplifiers includes a switch connected to a direct current power supply through a primary coil, and controlled on/off by the predetermined frequency signal, a tank circuit having a resonant frequency equal to the on/off frequency of the above switch, and a coil having a mutual inductance with the above tank circuit, and that the coil having the mutual inductance is connected to the rectifier circuit.

According to the present invention, a DC/DC converter capable of controlling an output signal by the use of a broadband signal input can be provided. Also, using the above DC/DC converter as a power supply, a highly efficient power amplifier can be configured.

DETAILED DESCRIPTION OF THE PREFERRED EMBODIMENTS

Figure 1:
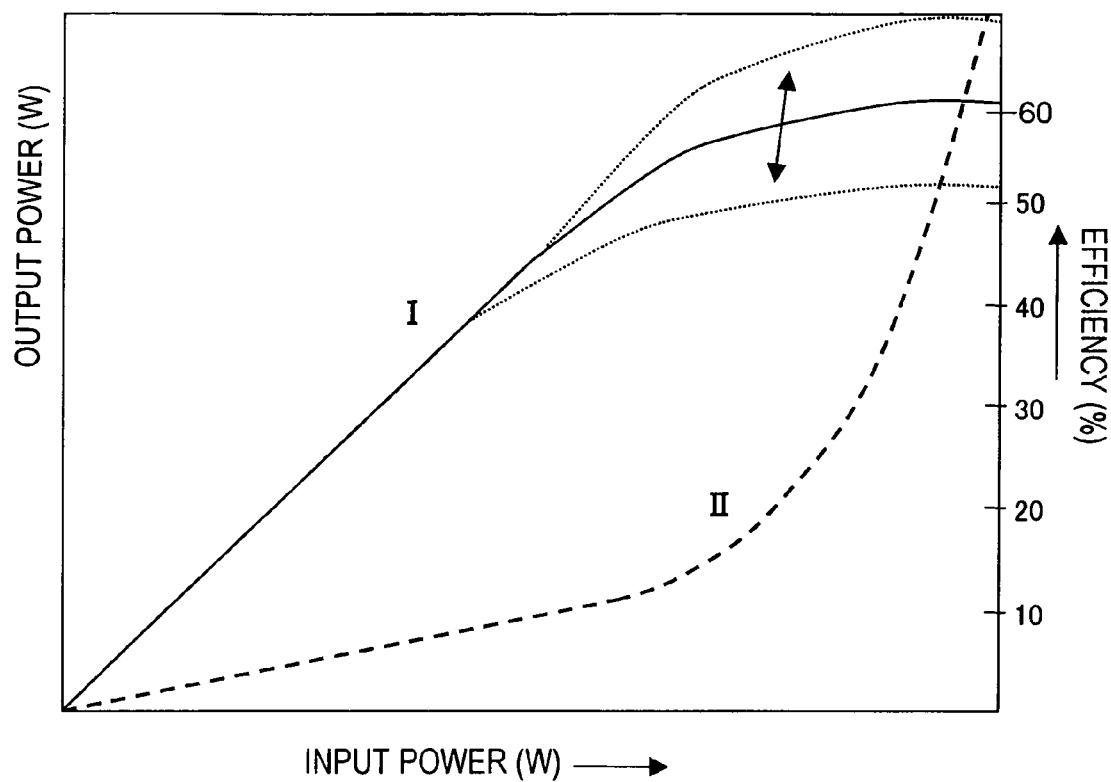
FIG. 1 shows a diagram for examining the input/output characteristic and the efficiency of an amplifier.
Figure 2:
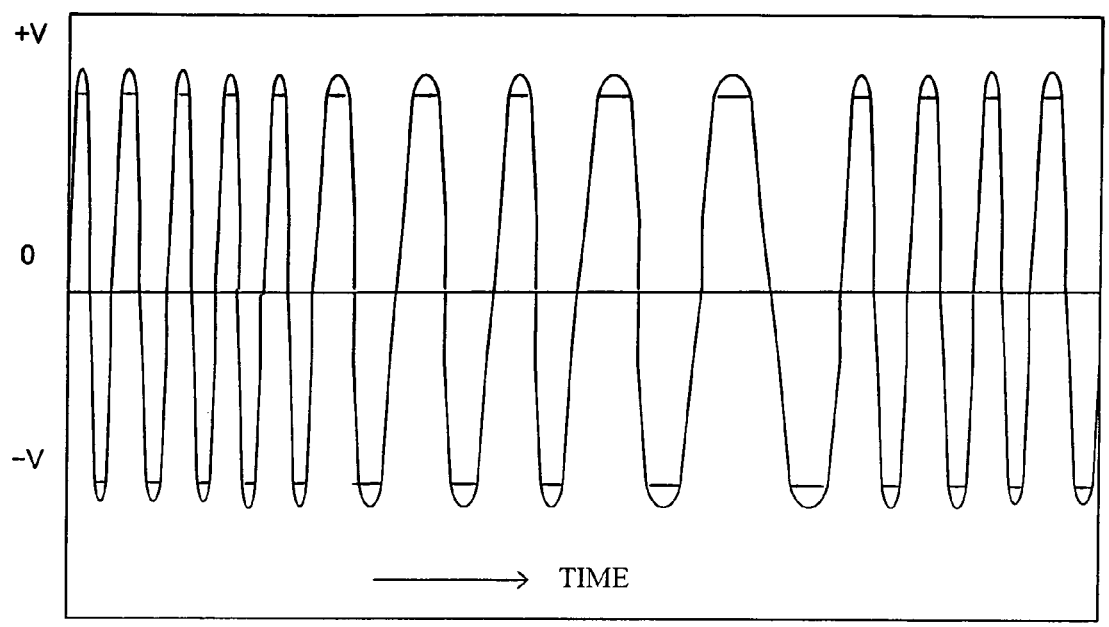
FIG. 2 shows a diagram illustrating a waveform of an FM analog modulated signal.
Figure 3:
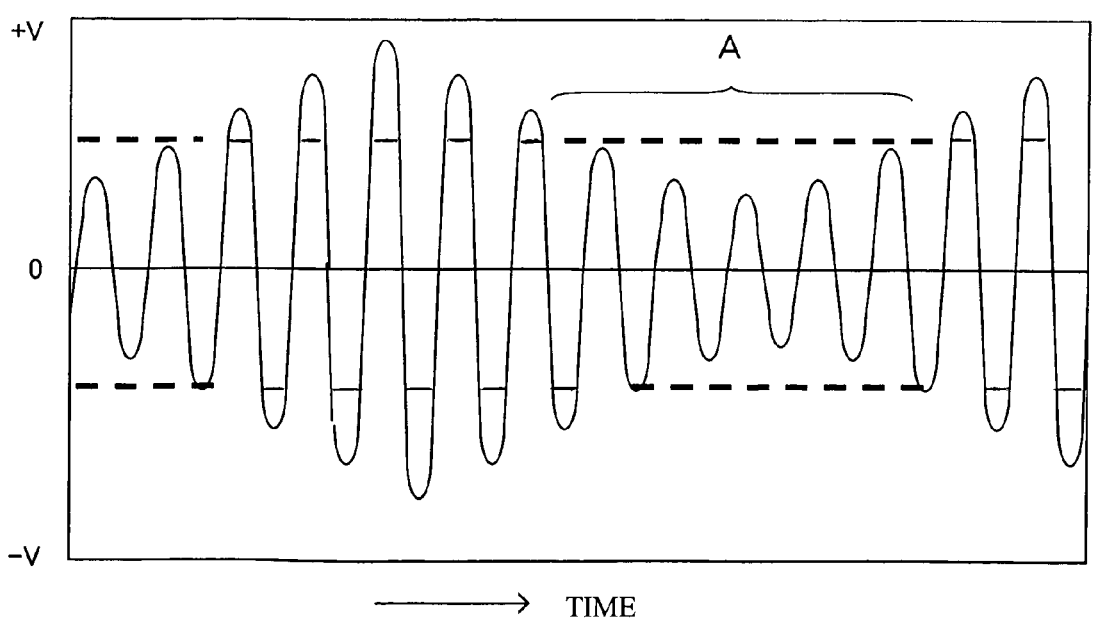
FIG. 3 shows a diagram illustrating a waveform of a modulated signal of a linear modulation scheme such as Quadrature Phase Shift Keying.
Figure 4:
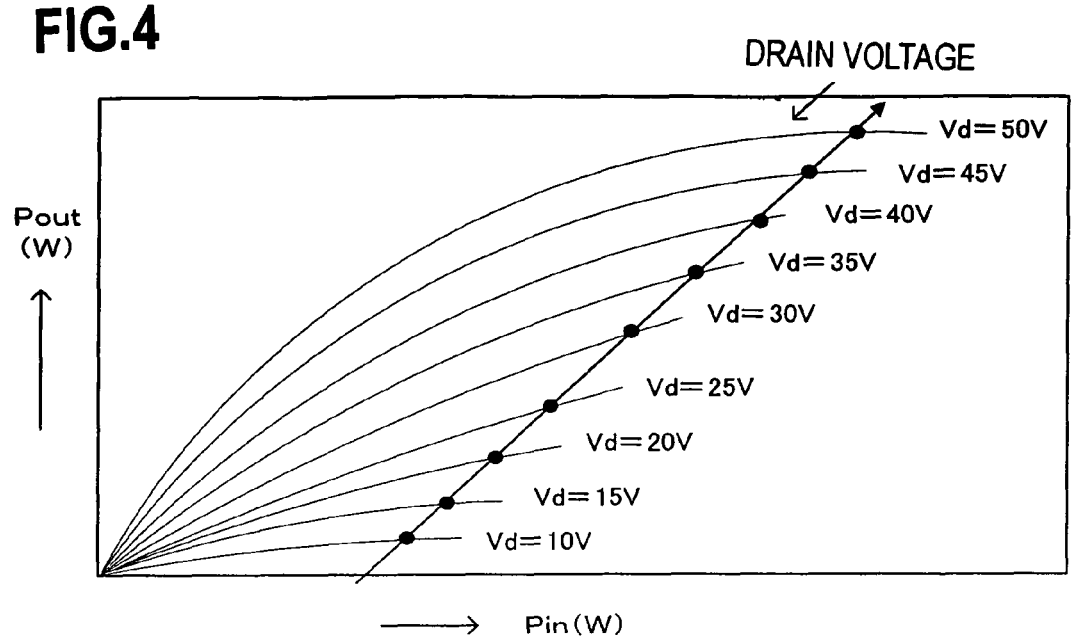
FIG. 4 shows a diagram explaining that the collector voltage or the drain voltage of an amplification device constituting a power amplifier is varied in an adaptive manner.
Figure 5:
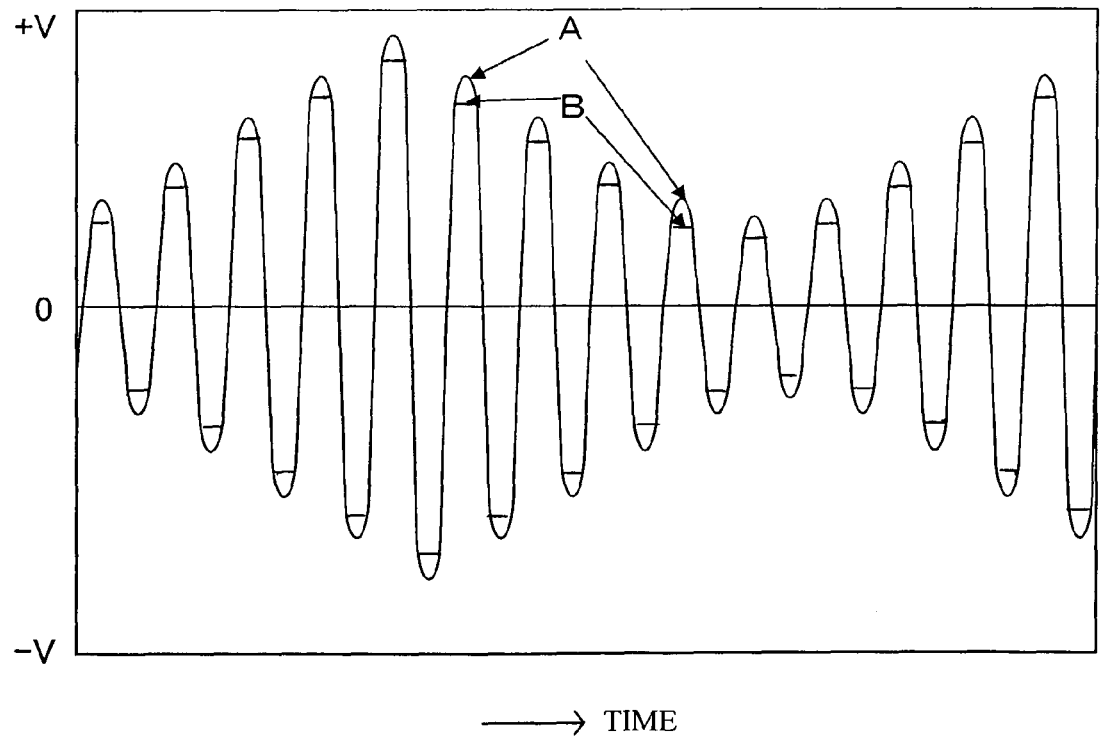
FIG. 5 shows a diagram illustrating that output saturation is given to the entire amplitude of the signal waveform shown in FIG. 3.
Figure 6:
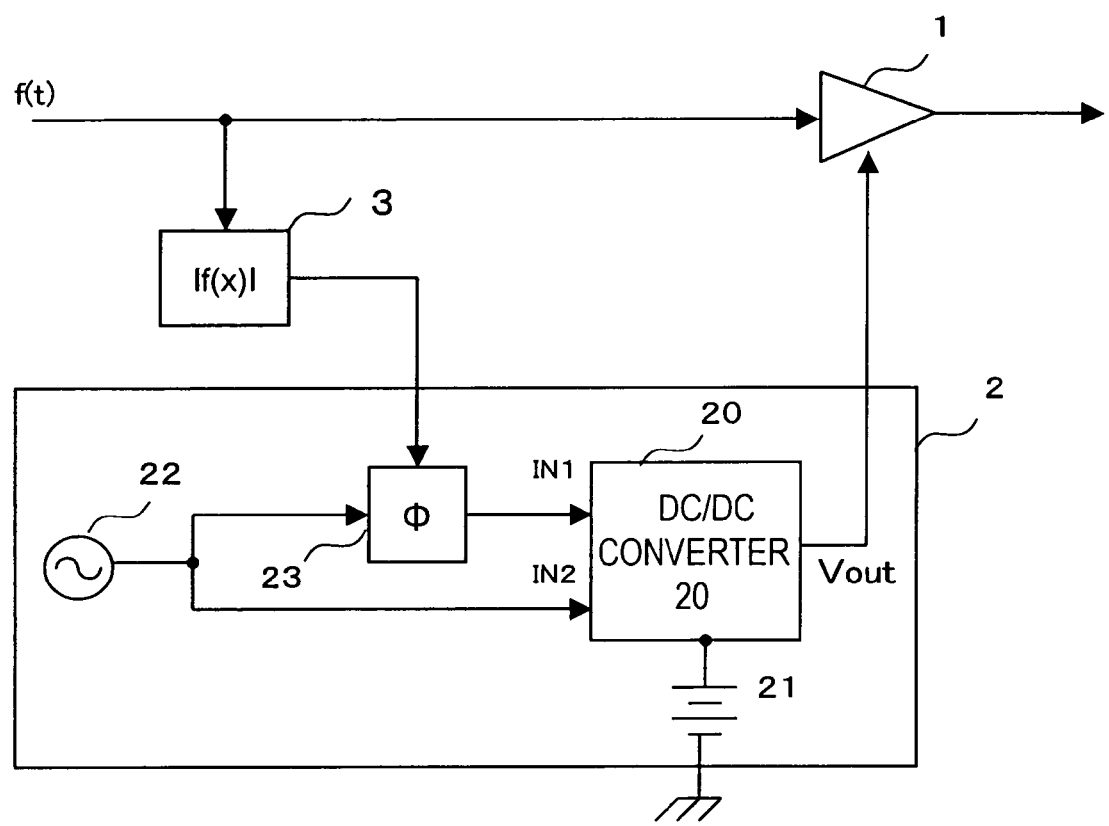
FIG. 6 shows an exemplary configuration diagram of a power amplifier applying the DC/DC converter according to the present invention.

The preferred embodiment of the present invention is described hereinafter referring to the charts and drawings. FIG. 6 shows an exemplary configuration block diagram, applying a DC/DC converter according to the present invention.

A power supply circuit 2 of a power amplifier unit 1 is constituted of a DC/DC converter 20 according to the present invention. A first and a second input terminal IN1, IN2 are provided on the input side of DC/DC converter 20, and an on/off control signal having a frequency $f_0$ (1 GHz, for example) being output from an oscillator 22 of a predetermined frequency signal is input to the input terminal IN1 side via a phase shifter 23, and is directly input to the other input terminal IN2 side.

The envelope amplitude of an input signal f(x) is obtained in an envelope detector 3, and thereby the phase shift magnitude of phase shifter 23 is controlled. With this, a phase difference between the signals of the predetermined frequency being input to the two input terminals IN1, IN2 of DC/DC converter 20 can be controlled corresponding to the input signal amplitude. Thus, the output of DC/DC converter 20, that is, the magnitude of the supply voltage to be supplied to power amplifier unit 1 is controlled by the input signal f(x).

Next, by exemplifying the configuration of DC/DC converter 20, the description that the output magnitude of DC/DC converter 20 is controlled correspondingly to the input signal f(x) will be given below.

Figure 7:
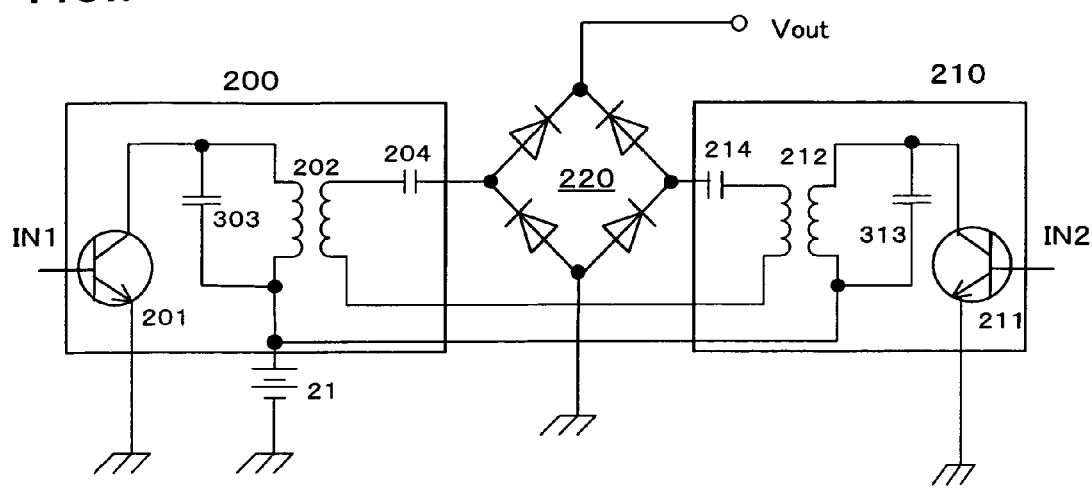
FIG. 7 shows one exemplary configuration of a DC/DC converter 20.

FIG. 7 shows one exemplary configuration of DC/DC converter 20. As a basic configuration, a pair of Class-C amplifiers 200, 210 is provided, and between each output thereof, a rectifier 220 is connected as a load. An output Vout of rectifier 220 is supplied as a supply voltage of power amplifier unit 1.

Figure 8:
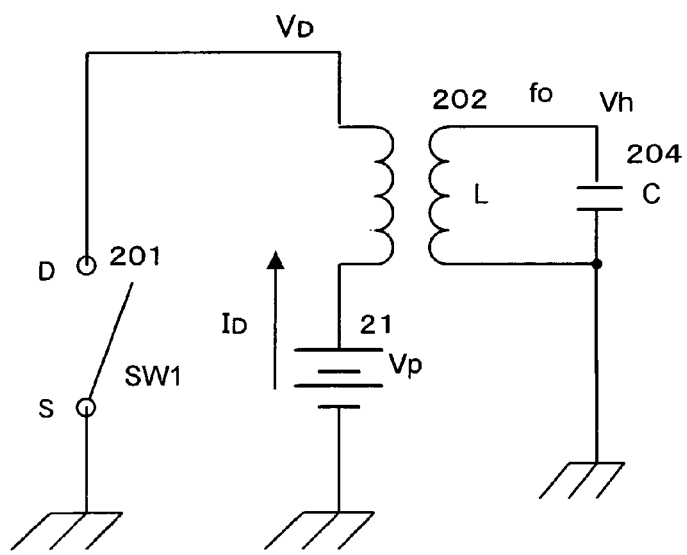
FIG. 8 shows a diagram illustrating the operation principle of a Class-C amplifier 200 (210).

The configurations of Class-C amplifiers 200, 210 are common, and using FIG. 8, the operation principle of Class-C amplifier 200 (210) is described in the following. FIG. 9 shows an operation waveform diagram of FIG. 8.

To a switching transistor 201 (switch SW1), the on/off control signal having a frequency $f_0$ being output from oscillator 22 is supplied. Therefore, in FIG. 8, the switch SW1 is operated on/off corresponding to the on/off control signal, and a drain current ID (FIG. 9C) flows from a supply voltage Vp. Meanwhile, by an inductance L of a coil 202 and a capacitance C of a capacitor 204, a tank circuit is configured, which resonates at the frequency $f_0$ (FIG. 9B).

Figure 9A:
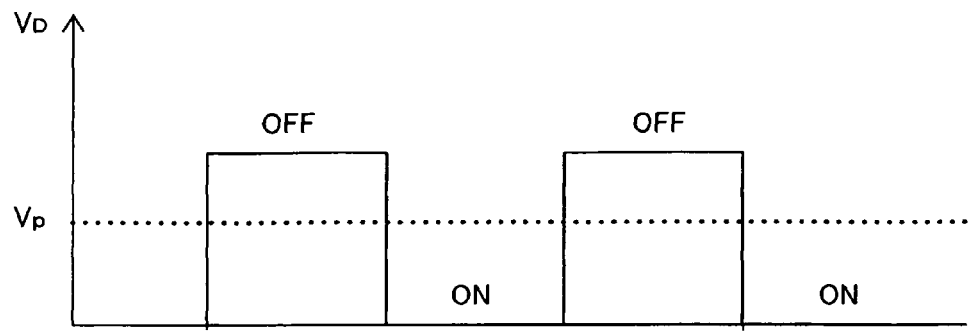
FIG. 9 shows an operation waveform diagram of FIG. 8.
Figure 9B:
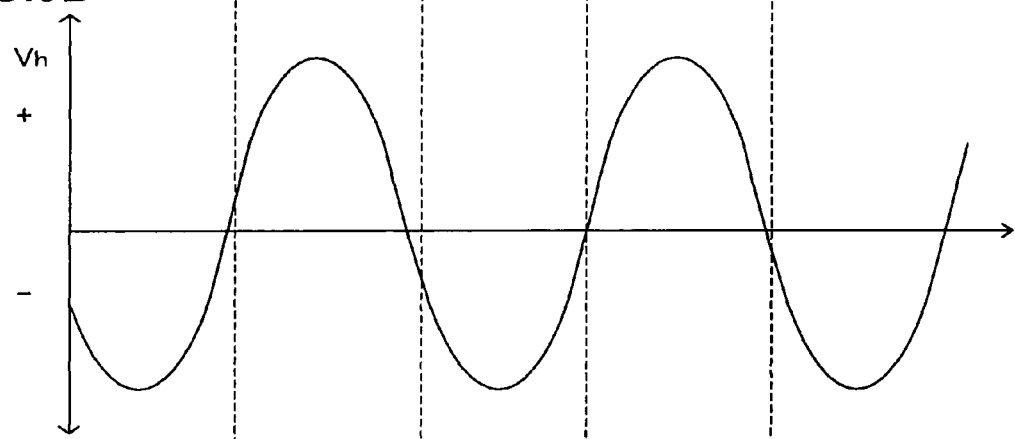

In FIG. 9, FIG. 9A shows the waveform of a drain voltage VD of switching transistor 201, and FIG. 9B shows a hot end voltage (Vh) of the tank circuit by the inductance L and the capacitance C.

Figure 9C:
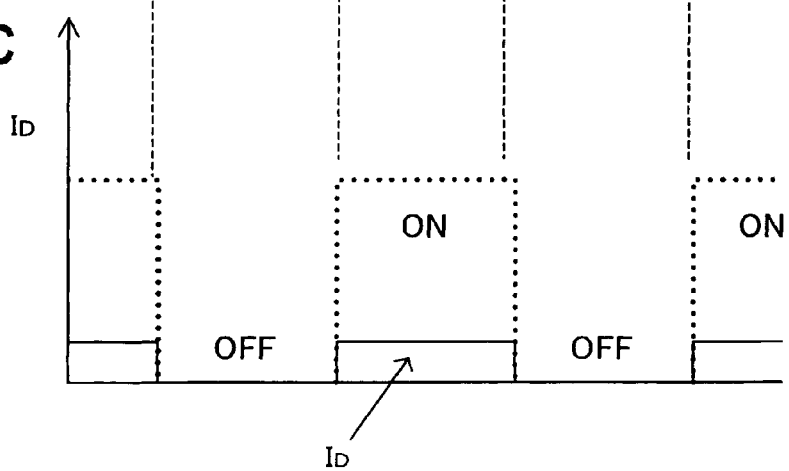

As to the drain current ID shown in FIG. 9C, the supply current ID is zero at the time transistor 201 is OFF, while the supply current ID flows at the time of ON. When the switch SW1 is ON, the ON resistance of transistor 201 (switch SW1) and the impedance of the tank circuit at the time of resonance become theoretically infinite, an actual supply current ID comes to have a small value, as shown in FIG. 9C.

Figure 10:
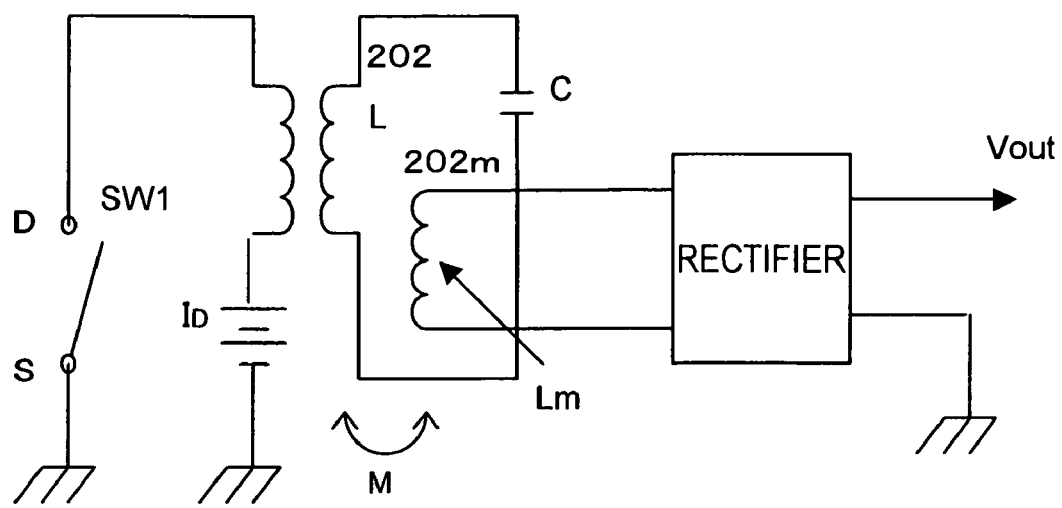
FIG. 10 shows a diagram illustrating an output extraction method in FIG. 8.
Figure 11:
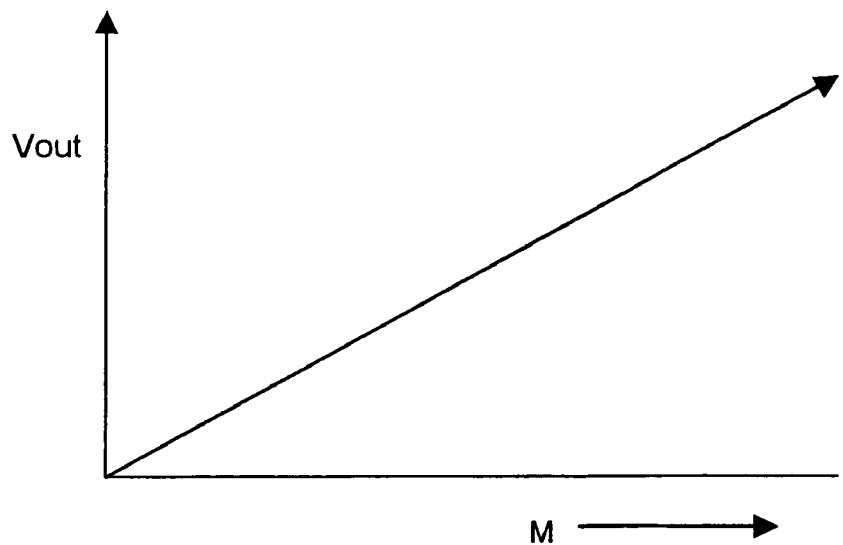
FIG. 11 shows a diagram illustrating the relationship between a mutual inductance M and an output voltage Vout.
Figure 12:
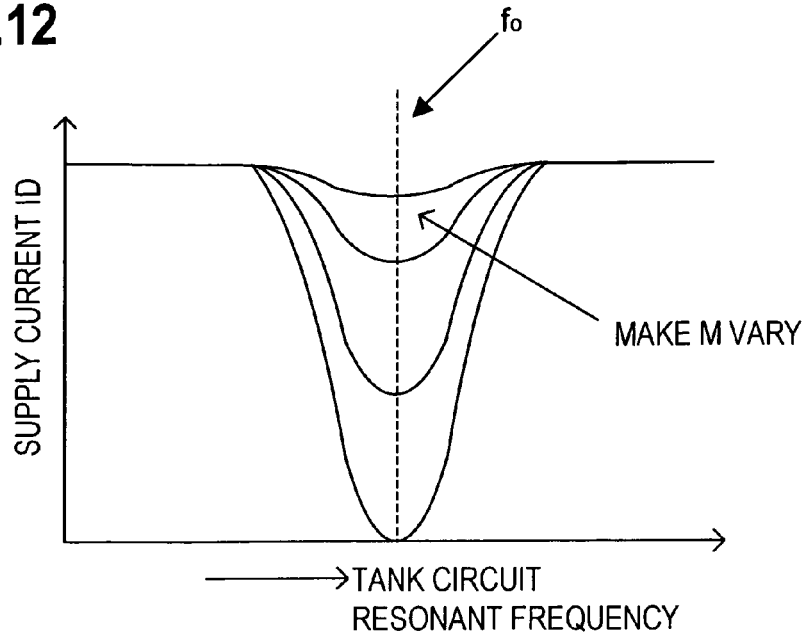
FIG. 12 shows a diagram illustrating the relationship between the resonant frequency of a tank circuit and a supply current ID.

Now, a method for extracting an output in FIG. 8 will be described. As shown in FIG. 10, when an output voltage is extracted by making a coil 202m having a mutual inductance M approach a coil 202, the relationship between the mutual inductance M and the output voltage Vout becomes as shown in FIG. 11. As shown in FIG. 11, when the mutual inductance M becomes large, in proportion thereto, the output voltage Vout of rectifier 220 becomes large. Meanwhile, at this time, as apparent from FIG. 12 indicating the relationship between the resonant frequency of the tank circuit and the supply current ID, the supply current ID becomes minimum at the resonant frequency $f_0$, and varies corresponding to the magnitude of the mutual inductance M.

Figure 13:
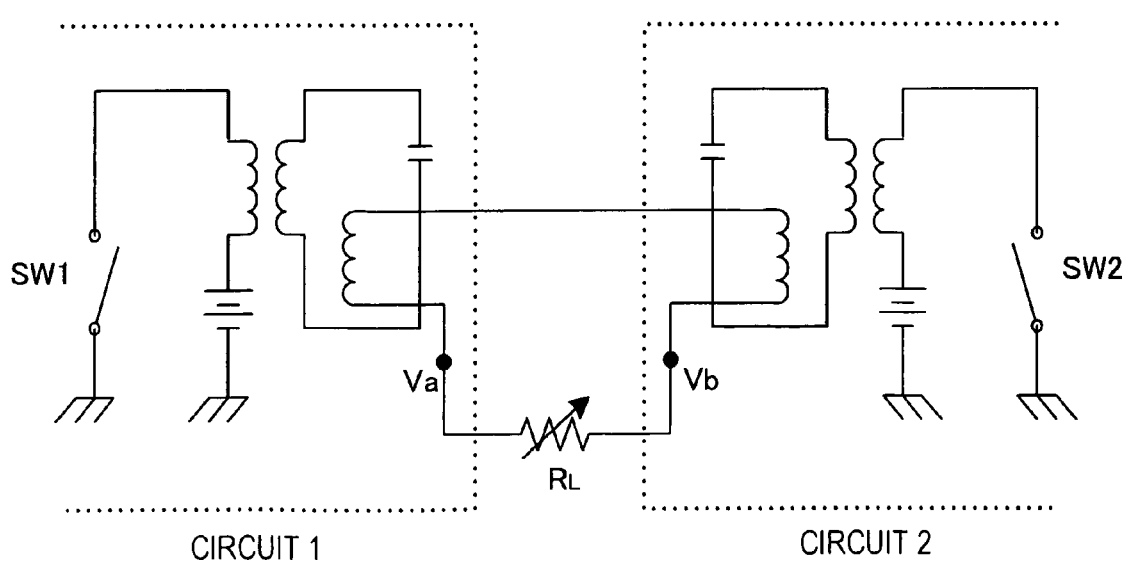
FIG. 13 shows a diagram illustrating the configuration of prepared two Class-C amplifiers, of which outputs are connected to both ends of a common load resistor RL.

Here, as shown in FIG. 7, by preparing two Class-C amplifiers shown in FIG. 10, there is considered a configuration such that the outputs thereof are connected to both ends of the common load resistor RL, as shown in FIG. 13. In FIG. 13, a circuit 1 and a circuit 2 are configured of Class-C amplifiers of an identical type, and between each output ends Va, Vb thereof, a load resistor RL is connected. If the voltages of the output ends Va, Vb are the same, the current flowing through the load resistor RL is zero. Further, if the voltages of the output ends Va, Vb have mutually opposite phases, the current flowing through the load resistor RL is maximum.

From the above point, it can be understood that, if a phase difference is given between the voltages of the output ends Va, Vb, the current flowing the load resistor RL varies between zero and a maximum value.

Figure 14:
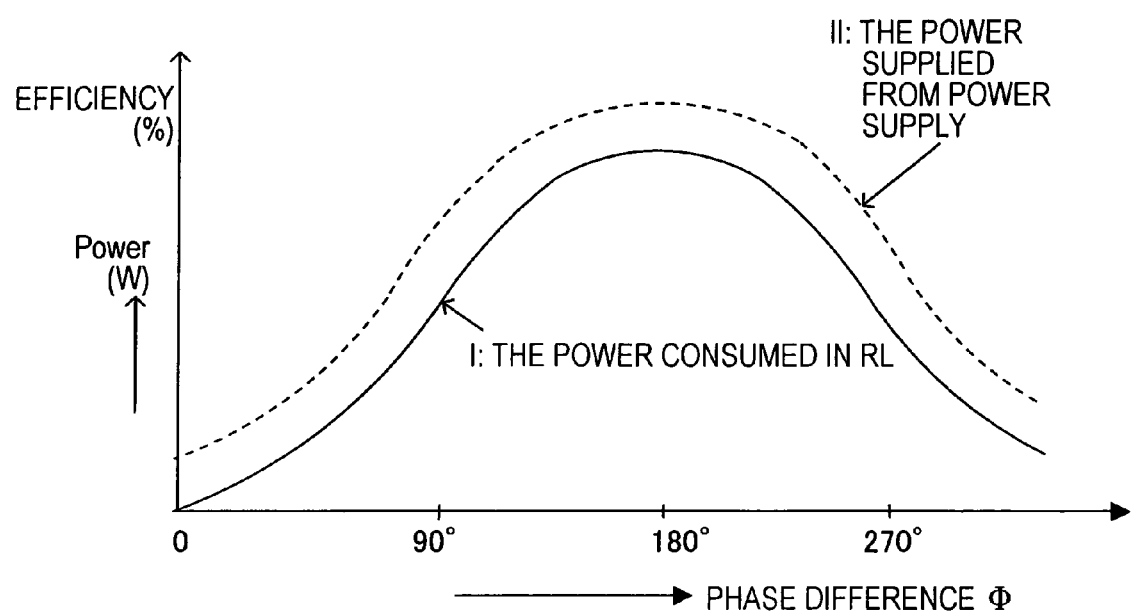
FIG. 14 shows a diagram illustrating the relationship between the phase difference Φ in output end voltages Va, Vb and the power I consumed in a load resistor RL.

FIG. 14 represents the above situation, representing the relationship between the phase difference Φ in the voltages of the output ends Va, Vb and power I consumed in the load resistor RL. When the phase difference Φ in the voltages of the output ends Va, Vb is 180°, the power supplied to the load resistor RL is maximum, and toward the phase difference of 0° or 360°, the power supplied to the load resistor RL becomes smaller.

At this time, in regard to power II supplied from a direct current power supply Vp, when the impedance of the tank circuit is regarded as infinite, the power II supplied from the direct current power supply Vp and the power I supplied to the load resistor RL is identical. In contrast, as described earlier, because the ON resistance of the switch SW1 (switch SW2) cannot be zero, by that amount, the power I supplied to the load resistor RL becomes slightly smaller than the power II supplied to the direct current power supply Vp.

Referring back to FIG. 7, in place of the load resistor RL in FIG. 13, rectifier circuit 220 is connected between the output ends of the two Class-C amplifiers 200, 210. The phase difference in between the output ends of Class-C amplifiers 200, 210 appears correspondingly to the phase difference of the input signals of switching transistors 201, 211.

Accordingly, from the relation shown in FIG. 14, it can easily be understood that the magnitude of the output Vout of rectifier circuit 220 varies in correspondence with the phase difference in the input signals of switching transistors 201, 211.

The present invention is based on the above operation principle. By referring back to the exemplary configuration diagram of the power amplifier shown in FIG. 6, to which the DC/DC converter according to the present invention is applied, it is explained that the phase difference between the two inputs of DC/DC converters 20, that is, the on/off control signals to control switching transistors 201, 211 on/off, is controlled by the magnitude of the input signal f(t) to be amplified by phase shifter 23.

Accordingly, the magnitude of the output of DC/DC converter 20, namely, the magnitude of the supply voltage to be supplied to power amplifier unit 1, is controlled by the magnitude of the input signal f(t).

With this, corresponding to the magnitude of the input signal f(t), it is possible to adaptively set the supply voltage of power amplifier unit 1, namely, the drain voltage or the collector voltage maximizing the amplification efficiency.

FIGS. 15 through 18 are diagrams illustrating other exemplary configurations 1 through 4 of the DC/DC converter according to the present invention.

Figure 15:
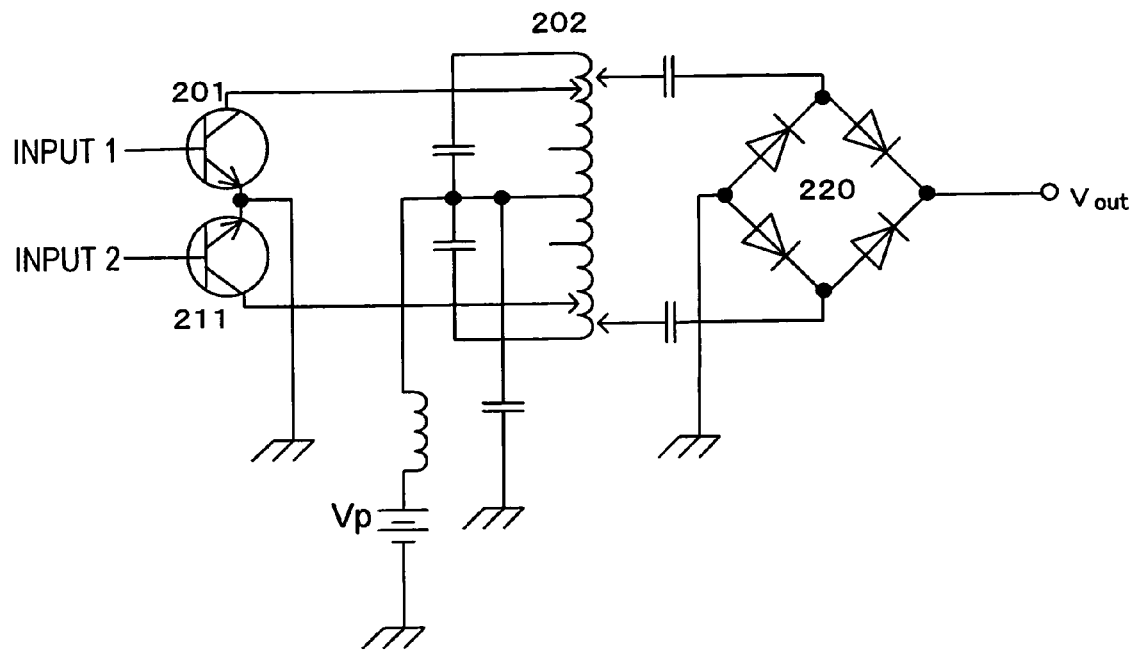
FIG. 15 shows a diagram illustrating an exemplary configuration 1 of a DC/DC converter according to the present invention.
Figure 16:
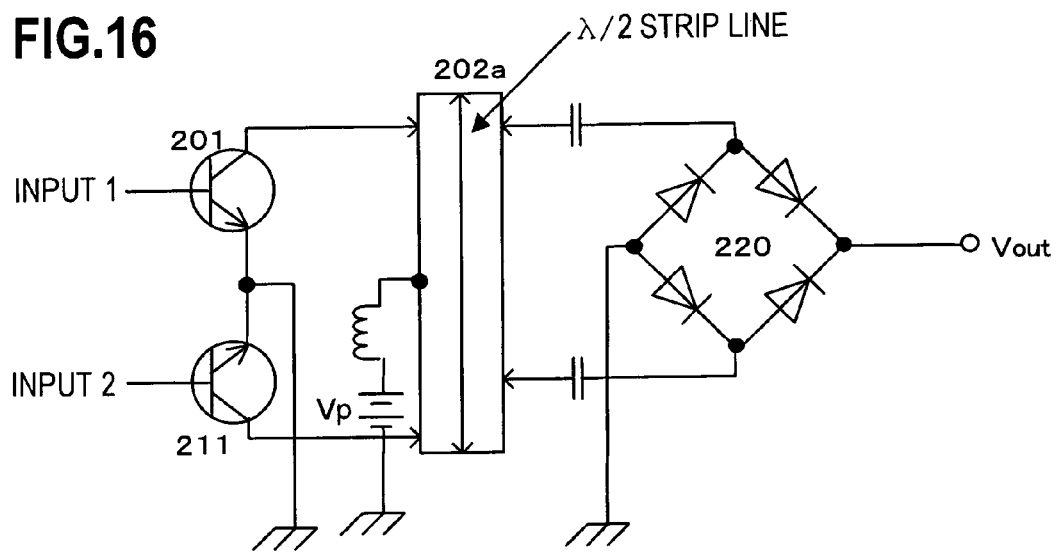
FIG. 16 shows a diagram illustrating an exemplary configuration 2 of a DC/DC converter according to the present invention.
Figure 17:
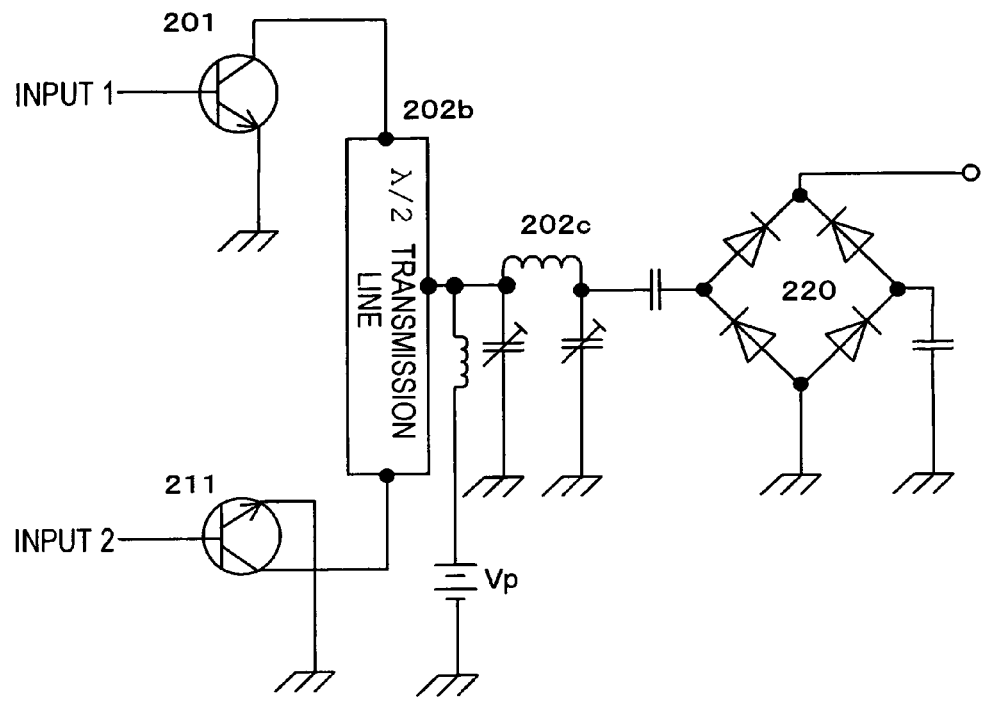
FIG. 17 shows a diagram illustrating an exemplary configuration 3 of a DC/DC converter according to the present invention.

FIG. 15 shows an exemplary configuration in which one coil 202 is employed, and switching transistors 201, 211 are connected in parallel. FIG. 16 shows an exemplary configuration having switching transistors 201, 211 similarly connected in parallel, and a λ/2 strip line 202a is employed. Further, in FIG. 17, there is a configuration having a λ/2 transmission line 202b and a series resonant circuit 202c.

Figure 18:
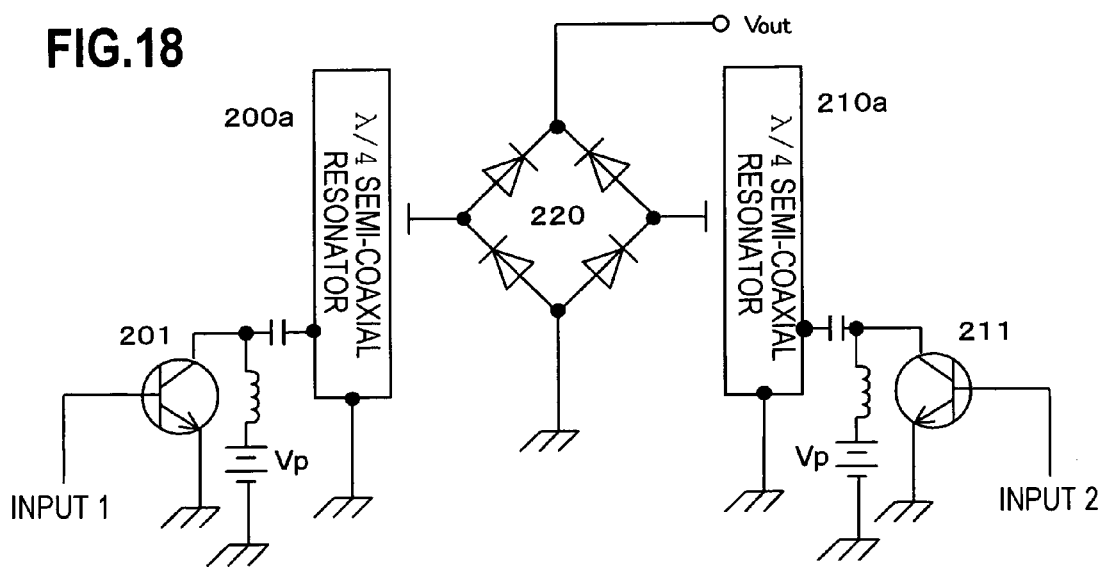
FIG. 18 shows a diagram illustrating an exemplary configuration 4 of a DC/DC converter according to the present invention.

FIG. 18 is realized using λ/4 semi-coaxial resonators 200a, 210a, respectively in place of class-C amplifiers 200, 210 shown in FIG. 6.

The output of the DC/DC converter in the above each embodiment is supplied to the collector or the drain of power unit 1, through an appropriate low pass filter.

INDUSTRIAL APPLICABILITY

As having been described above, according to the present invention, there is provided a DC/DC converter capable of controlling an output signal using a broadband signal input, and further, it is possible to provide a highly efficient power amplifier by employing the above DC/DC converter as a power supply. In particular, a highly efficient power amplifier with reduced power consumption can be obtained by applying the DC/DC converter according to the present invention to a broadband mobile terminal unit for W-CDMA or multicarrier transmission systems, such as OFDM, which are expected in future, and to a power supply for a transmission power amplifier in a base station, etc. From the above points, the present invention largely contributes to the industry.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A DC/DC converter comprising:
   a direct current voltage supply;
   first and second amplifiers, to respective inputs of which first and second signals are input, the first and second signals having a same predetermined frequency and having first and second phases, respectively, each of the first and second amplifiers including a switch circuit to switch on/off of the direct current by the direct current voltage supply according to the first and second signals; and
   a single rectifier circuit connected to an output of the first amplifier and connected to an output of the second amplifier to output a direct current voltage having a value corresponding to a phase difference between the first and second phases.

2. A DC/DC converter comprising:
   first and second amplifiers, to which first and second predetermined frequency signals respectively having first and second phases are input; and
   a rectifier circuit connected between respective output terminals of the first and second amplifiers, and configured to output a direct current voltage having a value corresponding to a phase difference between the first and second phases, wherein each of the first and second amplifiers comprises:
a primary coil;
a switch connected to a direct current power supply through the primary coil, and controlled on/off by the predetermined frequency signal;
a tank circuit having a resonant frequency equal to the on/off frequency of the switch; and
a coil having a mutual inductance with the tank circuit, and
wherein the coil having the mutual inductance is configured to be connected to the rectifier circuit.

3. A power amplifier comprising:
a power amplifier unit, to which an input signal is input; and
a power supply circuit configured to supply a supply voltage to the power amplifier unit, so that the power amplifier unit outputs an amplified input signal corresponding to the supply voltage,
wherein the power supply circuit comprises:
a direct current voltage supply;
an oscillator circuit configured to output first and second signals having a same predetermined frequency and respectively having first and second phases;
first and second amplifiers respectively configured to input the first and second signals, each of the first and second amplifiers including a switch circuit to switch on/off of the direct current of the direct current voltage supply according to the first and second signals;
a single rectifier circuit connected to an output of the first amplifier and connected to an output of the second amplifier to output a direct current voltage having a value corresponding to a phase difference between the first and second phases.

4. A power amplifier comprising:
a power amplifier unit, to which an input signal is input; and
a power supply circuit configured to supply a supply voltage to the power amplifier unit, so that the power amplifier unit outputs an amplified input signal corresponding to the supply voltage,
wherein the power supply circuit comprises:
an oscillator circuit configured to output first and second predetermined frequency signals respectively having first and second phases;
first and second amplifiers respectively configured to input the first and second predetermined frequency signals;
a rectifier circuit connected between respective output terminals of the first and second amplifiers, and configured to output a direct current voltage as the supply voltage, having a value corresponding to a phase difference between the first and second phases,
wherein each of the first and second amplifiers comprises:
a primary coil;
a switch connected to a direct current power supply through the primary coil, and controlled on/off by the predetermined frequency signal;
a tank circuit having a resonant frequency equal to the on/off frequency of the switch; and
a coil having a mutual inductance with the tank circuit, and
wherein the coil having the mutual inductance is configured to be connected to the rectifier circuit.

5. A power amplifier comprising:
a power amplifier unit, to which an input signal is input; and
a power supply circuit configured to supply a supply voltage to the power amplifier unit, so that the power amplifier unit outputs an amplified input signal corresponding to the supply voltage,
wherein the power supply circuit comprises:
an oscillator circuit configured to output first and second predetermined frequency signals respectively having first and second phases;
first and second amplifiers respectively configured to input the first and second predetermined frequency signals;
a rectifier circuit connected between respective output terminals of the first and second amplifiers, and configured to output a direct current voltage as the supply voltage, having a value corresponding to a phase difference between the first and second phases; and
an envelop detector configured to detect an envelop component of the input signal,
wherein the oscillator circuit includes a phase shifter configured to shift a phase of the second determined frequency signal as corresponding to a value of the envelop component detected by the envelop detector, and
wherein the first predetermined frequency signal having the first phase is input to the first amplifier, and the second predetermined frequency signal having the second phase shifted by the phase shifter is input to the second amplifier.

* * * * *